(12) United States Patent
Liu et al.

(10) Patent No.: US 8,383,508 B2
(45) Date of Patent: Feb. 26, 2013

(54) METHOD FOR FABRICATING OPENING

(75) Inventors: Ming-Hsing Liu, Tainan (TW); Chia-Hsiun Yu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 271 days.

(21) Appl. No.: 12/426,287

(22) Filed: Apr. 20, 2009

(65) Prior Publication Data

US 2009/0227113 A1    Sep. 10, 2009

Related U.S. Application Data

(63) Continuation of application No. 11/309,097, filed on Jun. 22, 2006, now Pat. No. 7,550,377.

(51) Int. Cl.
*H01L 21/4763* (2006.01)
(52) U.S. Cl. ........................... 438/627; 438/618
(58) Field of Classification Search .................. None
See application file for complete search history.

(56) References Cited

U.S. PATENT DOCUMENTS

| 6,103,456 | A  | * | 8/2000  | Tobben et al. | 430/317 |
| 6,309,962 | B1 | * | 10/2001 | Chen et al.   | 438/638 |
| 6,337,269 | B1 | * | 1/2002  | Huang et al.  | 438/618 |
| 6,352,920 | B1 | * | 3/2002  | Shimomura     | 438/637 |
| 6,638,871 | B2 | * | 10/2003 | Wang et al.   | 438/694 |
| 7,192,878 | B2 | * | 3/2007  | Weng et al.   | 438/734 |
| 2007/0004214 | A1 | * | 1/2007 | Schaller et al. | 438/700 |
| 2009/0061634 | A1 | * | 3/2009 | Feurprier     | 438/700 |
| 2011/0155692 | A1 | * | 6/2011 | Yau           | 216/41  |

* cited by examiner

*Primary Examiner* — Zandra Smith
*Assistant Examiner* — Pamela E Perkins
(74) *Attorney, Agent, or Firm* — Ding Yu Tan

(57) ABSTRACT

The present invention provides a fabrication method of an opening. The method includes providing a substrate having a conductive region therein. Thereafter, a dielectric layer is formed over the substrate and then a stacked layer is formed on the dielectric layer. The stacked layer includes a patterned metal hard mask layer, a patterned silicon oxynitride layer and a patterned silicon oxide layer on the dielectric layer in sequence. Afterward, a first portion of the dielectric layer is removed using the stacked layer as a first mask to form a first opening that exposes a surface of the conductive region.

16 Claims, 6 Drawing Sheets

METHOD FOR FABRICATING OPENING

CROSS-REFERENCE TO RELATED APPLICATION

This is a continuation application of and claims priority benefit of patent application Ser. No. 11/309,097, filed on Jun. 22, 2006. The entirety of the above-mentioned patent application is hereby incorporated by reference herein and made a part of this specification.

BACKGROUND OF THE INVENTION

1. Field of the Invention

The present invention relates to a method for fabricating an interconnect structure and an interconnect opening. More particularly, the present invention relates to a method for fabricating a single-damascene structure, a dual-damascene structure, and an opening thereof.

2. Description of Related Art

With the advancement of semiconductor technologies, the dimensions of semiconductor devices continuously reduce to the deep sub-micron territory. As the level of integration of integrated circuits increases, the surface of a chip is inadequate to accommodate all the required interconnects. In order to accommodate the increase of interconnects after the miniaturization of semiconductor devices, the design of a multilevel interconnect is used in ultra large scale integration circuits (ULSI).

In general, the multilevel interconnection is formed using a damascene process, which includes the single-damascene process or the dual-damascene process. Currently, the damascene process that involves the defining of a trench (or opening) in a dielectric layer requires forming a titanium nitride layer on the dielectric layer first. Thereafter, a photoresist layer with a trench (or opening) pattern is formed over the titanium nitride layer. The trench (or opening) pattern of the photoresist layer is then transferred to the titanium nitride layer. Further using the titanium nitride layer with the trench (or opening) pattern as a hark mask, a trench (or opening) is then defined in the dielectric layer. Limited by the yellow light process, a plasma-enhanced oxide (PE-oxide) layer is typically formed on the titanium nitride layer to increase the process window, wherein both the titanium nitride layer and the PE-oxide layer serve as the hard mask layer in the damascene process.

However, there are problems still needed to be resolved in a damascene process. For example, before defining the trench (or opening) in the dielectric layer, two etching steps are performed in order to define the trench (or opening) pattern in the hard mask layer. The two etching steps include a first etching step and a second etching step. The first etching step includes removing a portion of the PE-oxide layer until the surface of the titanium nitride layer is exposed using the photoresist layer as a mask. The second etching step includes etching a portion of the titanium nitride layer until the surface of the dielectric layer is exposed. Accordingly, the conventional damascene process requires performing multiple steps, and thus a longer cycle time is resulted.

SUMMARY OF THE INVENTION

Accordingly, the present invention at least provides a method for fabricating an opening, in which the process step is simplified and the cycle time is conserved.

The present invention provides a fabrication method of an opening. The method includes providing a substrate having a conductive region therein. Thereafter, a dielectric layer is formed over the substrate and then a stacked layer is formed on the dielectric layer. The stacked layer includes a patterned metal hard mask layer, a patterned silicon oxynitride layer and a patterned silicon oxide layer having the same pattern on the dielectric layer in sequence. Afterward, a first portion of the dielectric layer is removed using the stacked layer as a first mask to form a second opening that exposes a surface of the conductive region.

According to an embodiment of the present invention, in the fabrication method of the above-mentioned opening, the step of forming the stacked layer includes forming sequentially a metal hard mask layer, a silicon oxynitride layer and a silicon oxide layer on the dielectric layer. Thereafter, a first bottom antireflection layer and a patterned photoresist layer on the silicon oxide layer are formed sequentially. After this, the metal hard mask layer, the silicon oxynitride layer, the oxide layer and the first bottom antireflection layer that are not covered by the patterned photoresist layer are removed in a single process step until a part of a surface of the dielectric layer is exposed so as to form the patterned metal hard mask layer, the patterned silicon oxynitride layer, the patterned silicon oxide layer and a patterned first bottom antireflection layer. Afterward, the patterned photoresist layer and the patterned first bottom antireflection layer are removed.

According to an embodiment of the present invention, in the fabrication method of the above-mentioned opening, the patterned hard mask layer includes, but not limited to, tantalum, tantalum nitride, titanium, titanium nitride, tungsten and tungsten nitride.

According to an embodiment of the present invention, in the fabrication method of the above-mentioned opening, the second opening is a single-damascen opening According to an embodiment of the present invention, the fabrication method of the above-mentioned opening further includes before the first portion of the dielectric layer is removed, forming a first opening in the dielectric layer, so that a dual damascene opening constructs the second opening after the step of removing the first portion of the dielectric layer is performed.

According to an embodiment of the present invention, in the fabrication method of the above-mentioned opening, the step of forming the first opening in the dielectric layer includes forming a second patterned photoresist layer over the substrate to expose a surface of a second portion of the dielectric layer and to cover the patterned oxide layer, the patterned silicon oxynitride layer and a third portion of the dielectric layer. Thereafter, the second portion of the dielectric layer is removed to form the first opening in the dielectric layer using the second patterned photoresist layer as a second mask. After this, the second patterned photoresist layer is removed.

According to an embodiment of the present invention, in the fabrication method of the above-mentioned opening, before the second patterned photoresist layer is formed, a second bottom antireflection layer is further formed over the substrate.

According to an embodiment of the present invention, in the fabrication method of the above-mentioned opening, the stacked layer has a trench pattern.

According to an embodiment of the present invention, in the fabrication method of the above-mentioned opening, the conductive region is a conductive line.

According to an embodiment of the present invention, in the fabrication method of the above-mentioned opening, the dielectric layer is formed with a material including a low dielectric constant material.

The present invention also provides a fabrication method of an opening. The method includes providing a substrate having a conductive region therein. Thereafter, a dielectric layer over the substrate is formed and then a metal hard mask layer and a silicon oxynitride layer are formed sequentially over the dielectric layer. After this, a surface property alteration process is performed to form a modified layer on the silicon oxynitride layer. Afterward, the modified layer, the silicon oxynitride layer and the metal hard mask layer are patterned to form a stacked layer including a patterned modified layer, a patterned silicon oxynitride layer and a patterned metal hard mask layer having the same pattern. A first portion of the dielectric layer is removed to form a second opening that exposes a surface of the conductive region using the stacked layer as a first mask.

According to an embodiment of the present invention, in the fabrication method of the above-mentioned opening, the surface property alteration process includes a plasma process.

According to an embodiment of the present invention, in the fabrication method of the above-mentioned opening, the step of forming the stacked layer includes forming sequentially a metal hard mask layer and a silicon oxynitride layer on the dielectric layer before the surface property alteration process is performed to form the modified layer on the silicon oxynitride layer. A first bottom antireflection layer and a patterned photoresist layer are formed sequentially on the modified layer. Afterward, the metal hard mask layer, the silicon oxynitride layer, the modified layer and the first bottom antireflection layer that are not covered by the patterned photoresist layer are removed in a single process step until a part of a surface of the dielectric layer is exposed so as to form the patterned metal hard mask layer, the patterned silicon oxynitride layer, the patterned silicon oxide layer and a patterned first bottom antireflection layer. The patterned photoresist layer and the patterned first bottom antireflection layer are removed.

According to an embodiment of the present invention, in the fabrication method of the above-mentioned opening, the patterned hard mask layer includes, but not limited to, tantalum, tantalum nitride, titanium, titanium nitride, tungsten and tungsten nitride.

According to an embodiment of the present invention, in the fabrication method of the above-mentioned opening, the second opening is a single-damascen opening.

According to an embodiment of the present invention, the fabrication method of the above-mentioned opening further includes before the first portion of the dielectric layer is removed, forming a first opening in the dielectric layer, so that a dual damascene opening constructs the second opening after the first portion of the dielectric layer is removed.

According to an embodiment of the present invention, in the fabrication method of the above-mentioned opening, the step of forming the first opening in the dielectric layer includes forming a second patterned photoresist layer over the substrate to expose a surface of a second portion of the dielectric layer and to cover the patterned oxide layer, the patterned silicon oxynitride layer and a third portion of the dielectric layer. After this, the second portion of the dielectric layer is removed to form the first opening in the dielectric layer using the second patterned photoresist layer as a second mask. Thereafter, the second patterned photoresist layer is removed.

According to an embodiment of the present invention, in the fabrication method of the above-mentioned opening, before the second patterned photoresist layer is formed, a second bottom antireflection layer is further formed over the substrate.

According to an embodiment of the present invention, in the fabrication method of the above-mentioned opening, the stacked layer has a trench pattern.

According to an embodiment of the present invention, in the fabrication method of the above-mentioned opening, the conductive region is a conductive line.

According to the fabrication method and the damascene structure of the present invention, the plasma enhanced oxide layer (PE-oxide) in the prior art is replaced by the silicon oxynitride layer. Moreover, before the step of defining the trench in the dielectric layer, only a single etching step is required to define the trench (or opening) pattern in the hard mask layer. Therefore, the process step of the fabrication method of the present invention is simplified and the cycle time is reduced.

Several exemplary embodiments of the invention will now be described in detail with reference to the accompanying drawings. It is to be understood that the foregoing general description and the following detailed description of preferred purposes, features, and merits are exemplary and explanatory towards the principles of the invention only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention. It is to be understood that both the foregoing general description and the following detailed description are exemplary, and are intended to provide further explanation of the invention as claimed.

FIGS. 1A to 1D are schematic diagrams showing the method for fabricating a single-damascene opening according to one embodiment of the present invention.

Figure 1A:
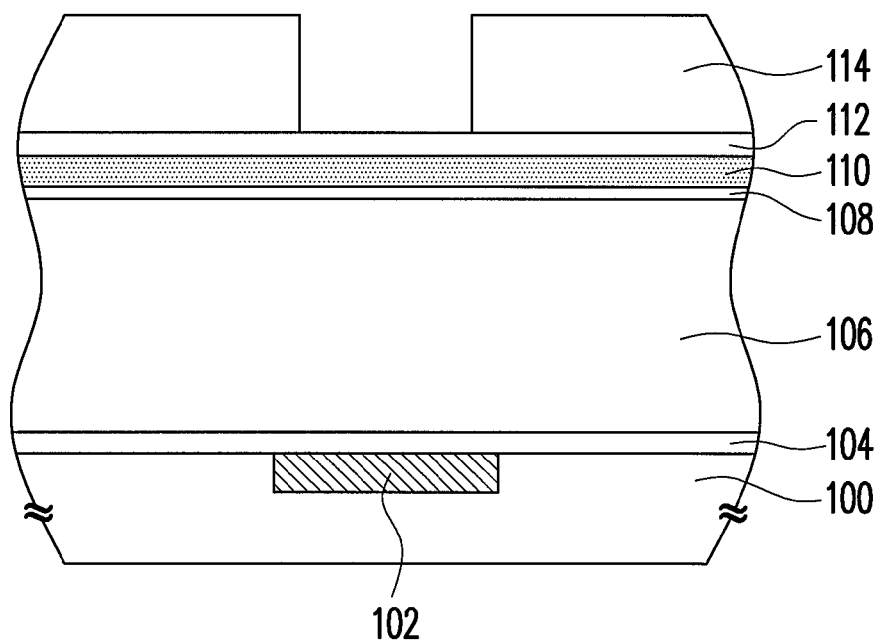
FIGS. 1A to 1D are schematic diagrams showing the method for fabricating a single-damascene opening according to one embodiment of the present invention.

Referring to FIG. 1A, a substrate 100 is provided, wherein a conductive line 102 is already formed in the substrate 100. The conductive line 102 is formed with copper, for example.

Still referring to FIG. 1A, a barrier layer 104, a dielectric layer 106, a metal hard mask layer 108, a silicon oxynitride layer 110, a bottom antireflection layer 112 and a patterned photoresist layer 114 are sequentially formed on the substrate 100.

The material of the photoresist layer 114 includes silicon nitride or other suitable materials. The photoresist layer 114 is formed by chemical vapor deposition, for example. The barrier layer 104 serves to prevent the oxidation of the copper surface and the diffusion of copper to the dielectric layer 106. The dielectric layer 106 is, for example, a low dielectric constant dielectric layer which is formed with a low dielectric constant material including inorganic materials, such as hydrogen silsesquioxane (HSQ), fluronated silicon glass (FSG), etc., or organic materials, such as fluorinated poly (arylene ether) (Flare), aromatic hydrocarbons (SILK), polyarylethers (parylene), etc. The dielectric layer 106 is formed by chemical vapor deposition, for example. In one embodiment, the dielectric layer 106 is constituted with a low dielectric constant dielectric layer and an insulation layer, wherein the insulation layer can also serve as a chemical mechanical polishing (CMP) stop layer to prevent the dielectric layer 106 from being polished during the CMP process. The material of the metal hard mask layer 108 includes tantalum, tantalum nitride, titanium, titanium nitride, tungsten or tungsten nitride, and the metal hard mask layer 108 is formed by chemical vapor deposition. The bottom antireflection layer is an organic bottom antireflection layer or inorganic bottom antireflection layer. The inorganic antireflection layer is formed by chemical vapor deposition, for example. The material of the inorganic antireflection layer includes, but not limited to, a non-crystalline phase carbon film, silicon nitride, silicon oxynitride or titanium nitride, etc.

In one embodiment, after forming the silicon oxynitride layer 110 and before forming the bottom antireflection layer 112, a silicon oxide layer (not shown) can also form on the silicon oxynitride layer 110 so that the refractive index (n) and the dielectric constant (k) of the silicon oxynitride layer 110 remain unchanged over time.

In another embodiment, after forming the silicon oxynitride layer 110, and before forming the bottom antireflection layer 112, a surface property alteration process can perform on the silicon oxynitride layer 110 to form an oxide layer (not shown) on the silicon oxynitride layer 110 in order to maintain the refractive index and the dielectric constant of the silicon oxynitride layer 110 from varying over time. The surface property alteration process includes a plasma process using an oxygen containing gas.

More particularly, the silicon oxynitride layer 110 can reduce the reflective light of the underlying reflective material (metal hard mask layer 108). Consequently, the photolithograph process is improved.

Figure 1B:
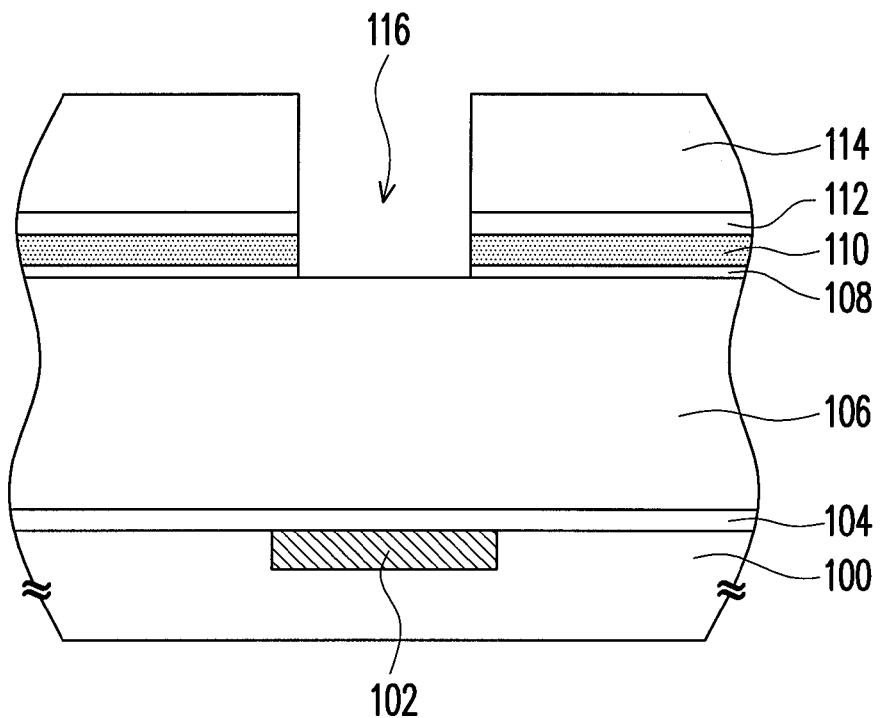

Referring to FIG. 1B, the bottom antireflection layer 112, the silicon oxynitride layer 110 and the metal hard mask layer 108 that are not covered by the patterned photoresist layer 114 are directly removed until a part of the surface of the dielectric layer 106 is exposed. In other words, the removal of the bottom antireflection layer 112, the silicon oxynitride layer 110 and the metal hard mask layer 108 that are not covered by the patterned photoresist layer 114 is completed by performing one etching process. In essence, only a single etching process is performed.

Figure 1C:
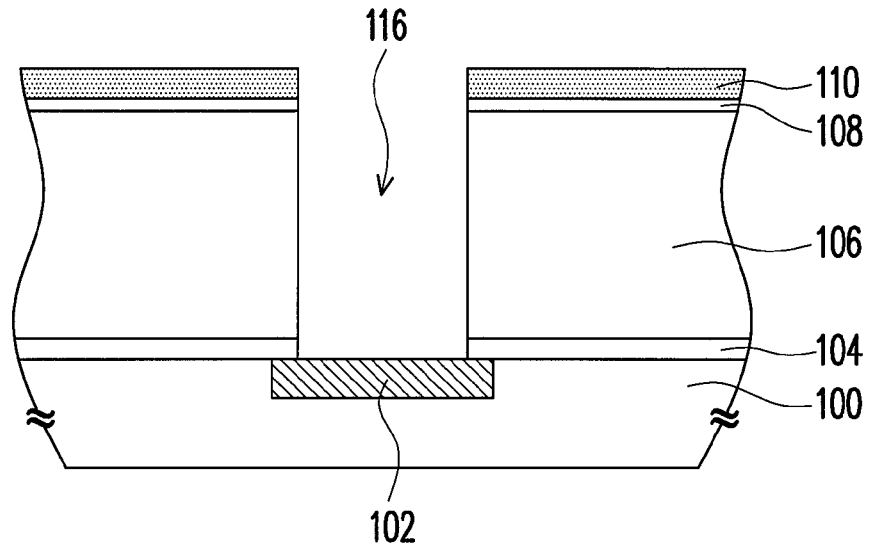

Continuing to FIG. 1C, the patterned photoresist layer 114 and the bottom antireflection layer 112 are removed, for example, by an etching process. Thereafter, the silicon oxynitride layer 110 and the metal hard mask layer 108 are used as a mask to remove a portion of the dielectric layer 106 104 to form a damascene opening 116 that exposes the surface of the conductive line 102. Removing the portion of the dielectric layer and the portion of the barrier layer is accomplished by removing the dielectric layer that is not covered by the silicon oxynitride layer 110 and the metal hard mask layer 108. The dielectric layer 106 is removed by, for example, performing an etching process. Thereafter, the exposed barrier layer 104 is removed, for example, by an etching process.

Figure 1D:
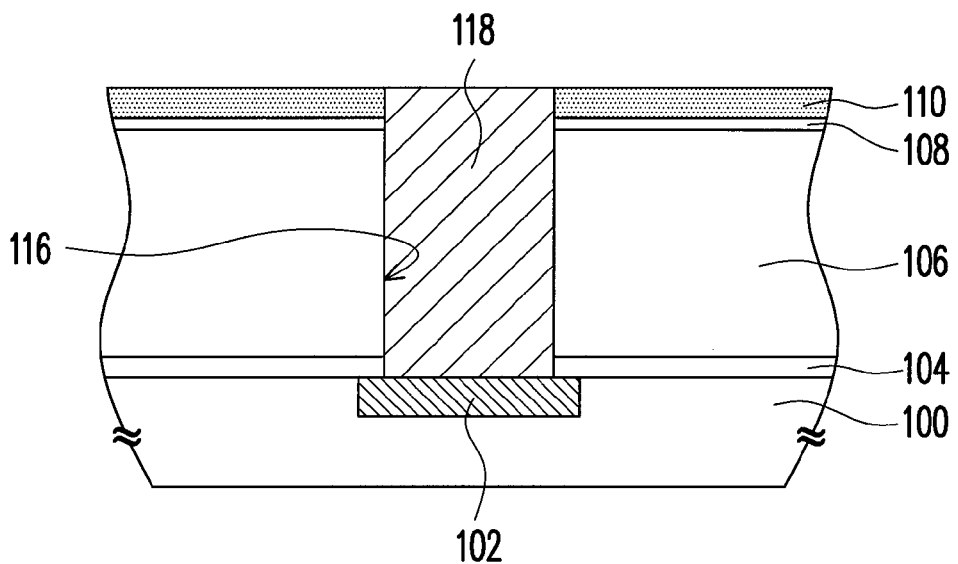

After this, as shown in FIG. 1D, the damascene opening 116 is filled with a conductive layer 118. Further using the CMP process to remove the excess metal, a single-damascene structure is formed. The material of the conductive layer 118 is metal or polysilicon, for example.

It is worthy to note that before the step of defining an opening in the dielectric layer, only a single etching step is performed to define the opening in the hard mask layer. Therefore, not only the process step is simplified, the cycle time is greatly conserved.

The single-damascene structure formed according the method of the fabrication is disclosed as follows. Since the materials of the parts of the damascene structure have been disclosed in the above embodiment, they will not be reiterated herein.

Still referring to FIG. 1D, the single-damascene structure includes the substrate 100, the barrier layer 104, the dielectric layer 106, the metal hard mask layer 108, the silicon oxynitride layer 110 and the conductive layer 119. The conductive line 102 is disposed in the substrate 100. The barrier layer 104 is disposed on the substrate 100, and the dielectric layer 106 is disposed on the barrier layer 104. The metal hard mask layer 108 is disposed on the dielectric layer 106, and the silicon oxynitride layer 110 is disposed on the metal hard mask layer 108. The damascene opening 116 exposing a part of the surface of the conductive line 102 is configured in the silicon oxynitride layer 110, the metal hard mask layer 108, the dielectric layer 106 and the barrier layer 104. The conductive layer 118 is disposed in the damascene opening 116.

In one embodiment, single-damascene structure further can include a silicon oxide layer (not shown), disposed on the silicon oxynitride layer 112.

In another embodiment, the single-damascene structure can include an oxide layer (not shown), disposed on the silicon oxynitride layer 112. The oxide layer is formed by performing a plasma process on the silicon oxynitride layer 112 to alter the surface property of silicon oxynitride layer 112. The above silicon oxide layer and oxide layer can serve to maintain the refractive index and the dielectric constant of the silicon oxynitride layer from changing over time.

FIGS. 2A to 2G are schematic diagrams showing the method for fabricating a dual-damascene opening according to one embodiment of the present invention. The same reference numbers are used in FIGS. 1A to 1D and FIGS. 2A to 2G to refer to the same or like parts.

Figure 2A:
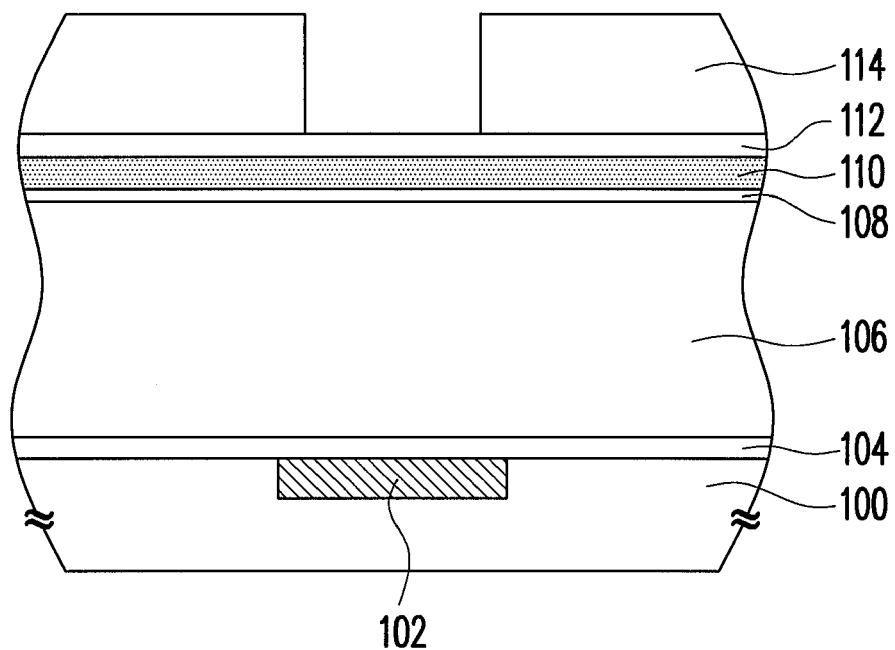
FIGS. 2A to 2G are schematic diagrams showing the method for fabricating a dual-damascene opening according to one embodiment of the present invention.

Referring to FIG. 2A, a substrate 100 is provided, wherein a conductive line 102 is already formed in the substrate 100. The conductive line 102 is formed with copper, for example.

Still referring to FIG. 2A, a barrier layer 104, a dielectric layer 106, a metal hard mask layer 108, a silicon oxynitride layer 110, a bottom antireflection layer 112 and a patterned photoresist layer 114 are sequentially formed on the substrate 100.

In one embodiment, after forming the silicon oxynitride layer 110 and before forming the bottom antireflection layer 112, a silicon oxide layer (not shown) can also form on the silicon oxynitride layer 110 so that the refractive index (n) and the dielectric constant (k) of the silicon oxynitride layer 110 remain unchanged over time.

In another embodiment, after forming the silicon oxynitride layer 110, and before forming the bottom antireflection layer 112, a surface property alteration process is performed on the silicon oxynitride layer 110 to form an oxide layer (not shown) on the silicon oxynitride layer 110 in order to maintain the refractive index and the dielectric constant of the silicon oxynitride layer 110 from changing over time. The surface property alteration process includes a plasma process using an oxygen containing gas.

Figure 2B:
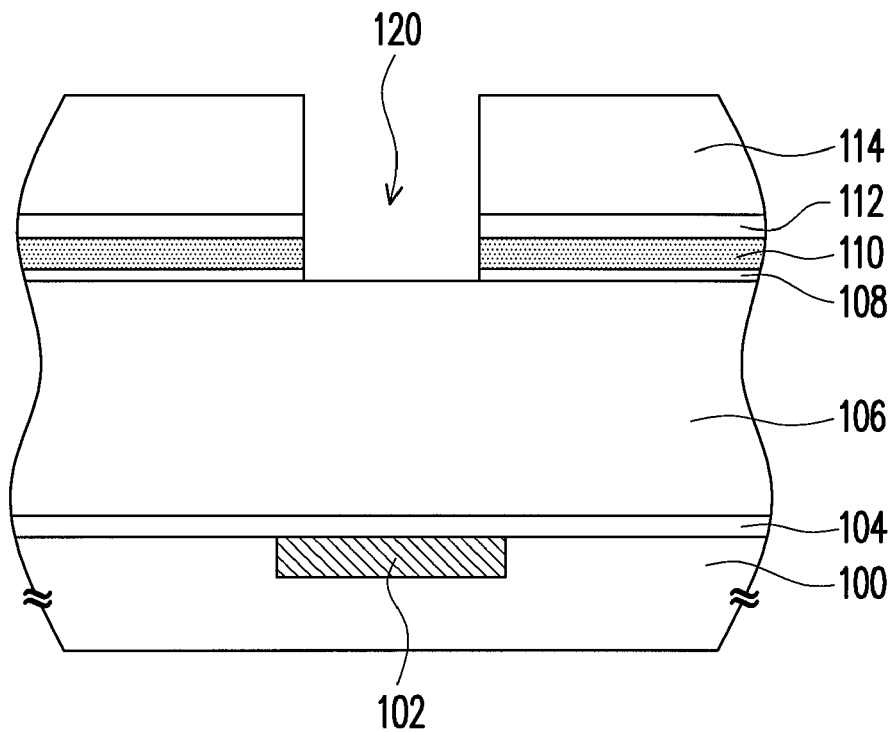

As shown in FIG. 2B, the bottom antireflection layer 112, the silicon oxynitride layer 112 and the metal hard mask layer 108 not covered by the patterned photoresist layer 114 are removed in a single process step to form a trench 120 that exposes the surface of a part of the dielectric layer 106.

Similarly, the silicon oxynitride layer 110 and the metal hard mask layer 108 are removed under the same etching condition. Therefore, unlike the conventional practice in which the metal hard mask layer and the overlying layer have different properties and are removed under different etching conditions, the process step of the present invention is greatly simplified and the cycle time is conserved to increase the yield.

Figure 2C:
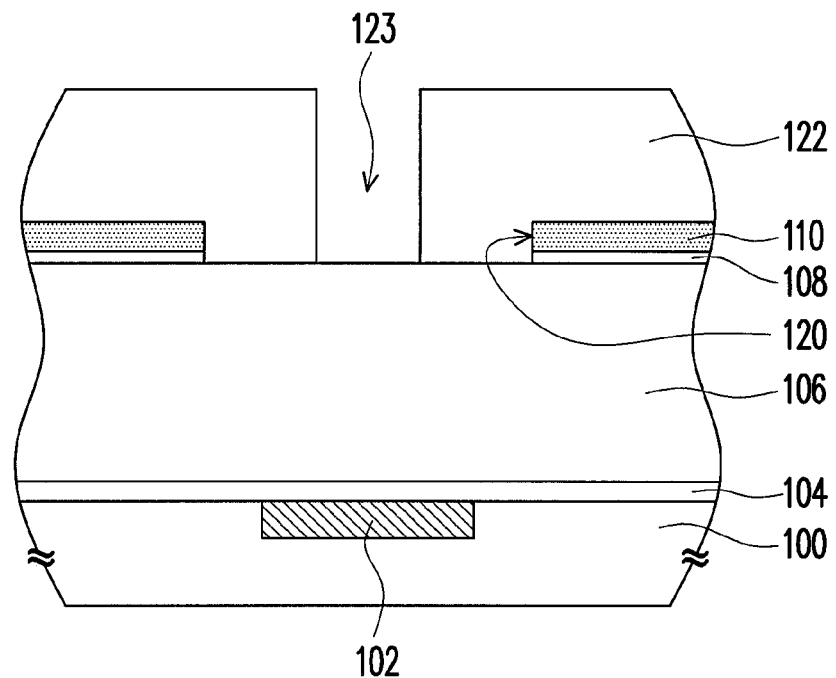

Thereafter, as shown in FIG. 2C, the patterned photoresist layer 114 and the bottom antireflection layer 112 are removed. A patterned photoresist layer 122 is then formed over the substrate 100 to cover the silicon oxynitride layer 110 and a part of the dielectric layer 106. This patterned photoresist layer 122 has an opening pattern 123 therein.

In one embodiment, before forming the patterned photoresist layer 122, a bottom antireflection layer (not shown) is formed over the substrate 100 to cover the silicon oxynitride layer 110 and the dielectric layer 106.

Figure 2D:
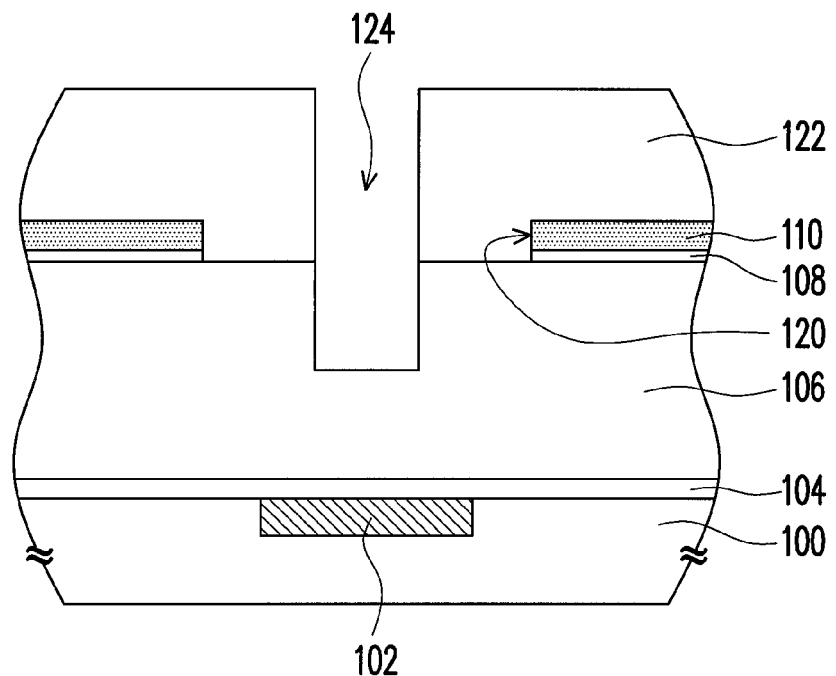

Referring to FIG. 2D, using the patterned photoresist layer 122 as a mask, a portion of the dielectric layer 106 is removed to form an opening 124 in the dielectric layer 106.

Figure 2E:
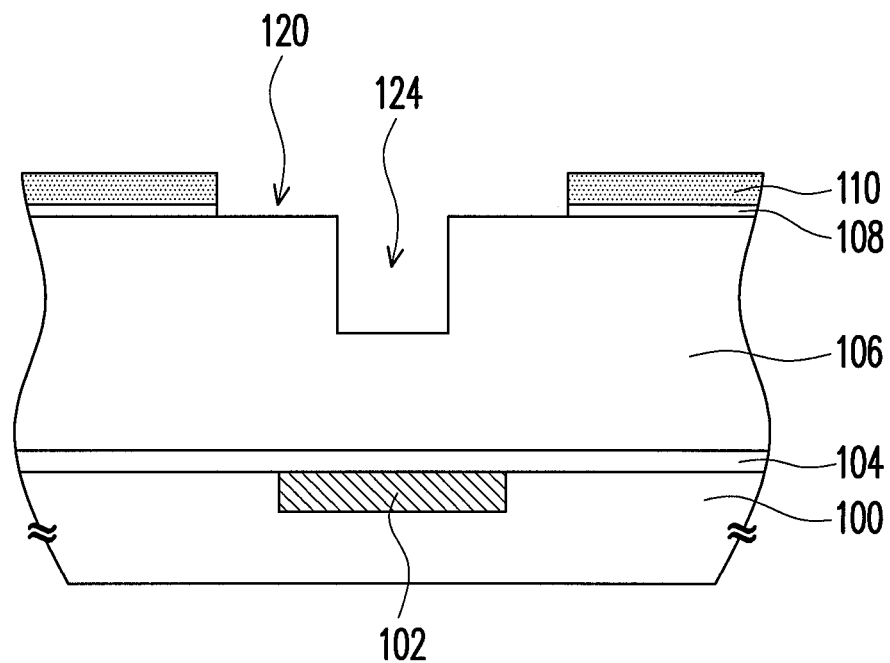

Continuing to FIG. 2E, the patterned photoresist layer 122 is removed, for example, by performing an etching process.

Figure 2F:
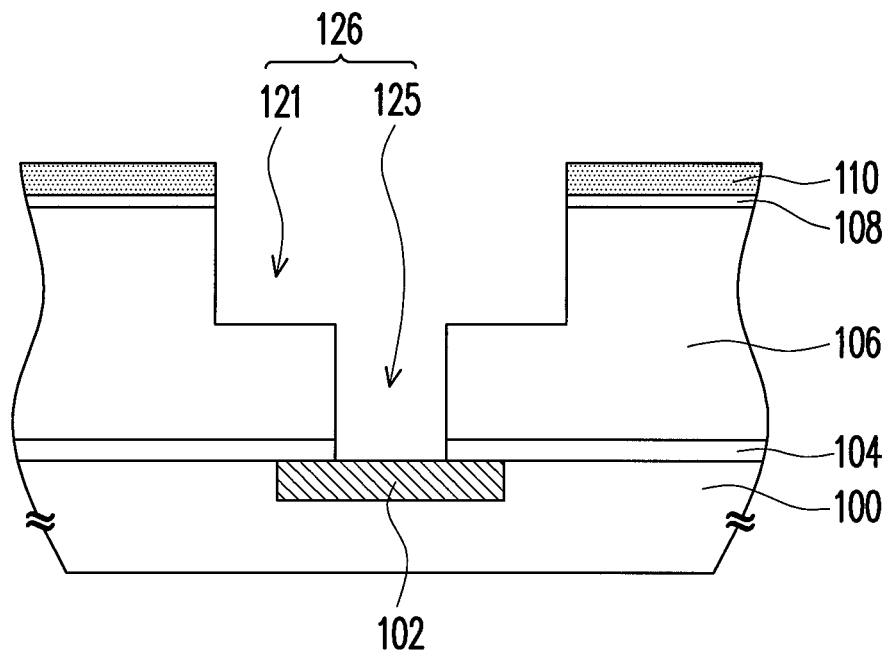

Thereafter, as shown in FIG. 2F, the silicon oxynitride layer 110 and the metal hard mask layer 108 are used as a mask, and a portion of the dielectric layer 106 104 are removed until the surface of the conductive line 102 is exposed to form a trench 121 and an opening 125. The trench 121 and the opening 125 serve as a dual-damascene opening 126.

Figure 2G:
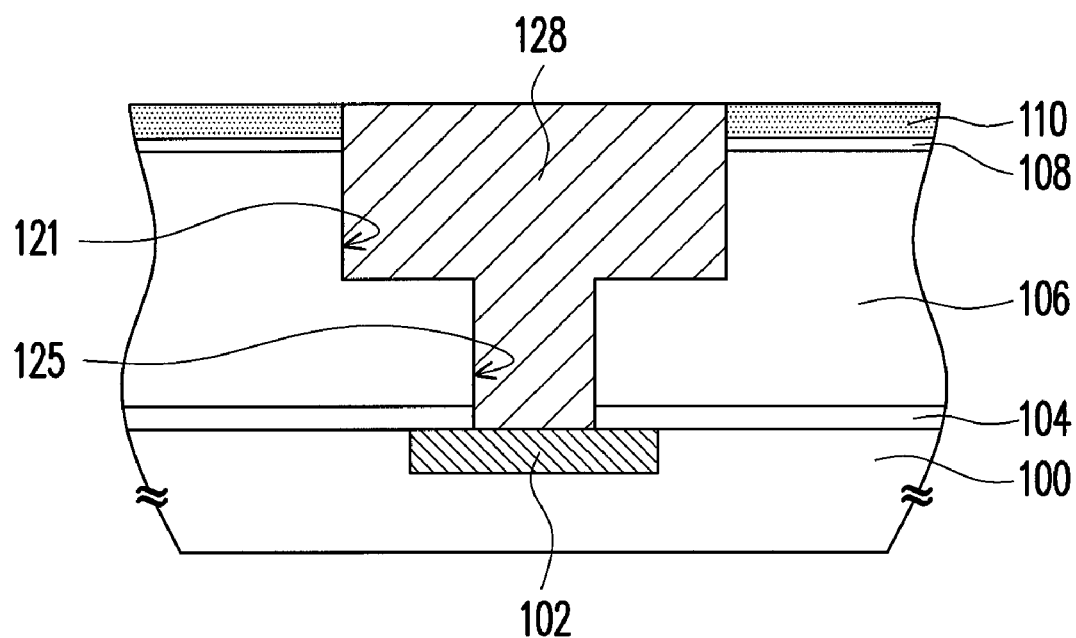

Continuing to FIG. 2G, the dual-damascene opening 126 is filled with a conductive layer 128. Further using a CMP process to remove the excess metal, a conductive line is formed in the trench 121 and a plug is formed in the opening 125, wherein the conductive line and the plug constitute a dual damascene structure. The material of the conductive layer 128 includes, but not limited to, a metal material or polysilicon.

The dual-damascene structure formed according the fabrication method of the present invention is disclosed as follows. Since the materials for the parts of the damascene structure have been disclosed in the above embodiment, they will not be reiterated herein.

Referring again to FIG. 2G, the dual-damascene structure mainly includes the substrate 100, the barrier layer 104, the dielectric layer 106, the metal hard mask layer 108, the silicon oxynitride layer 110 and the conductive layer 128. The conductive line 102 is configured in the substrate 100. The barrier layer 104 is disposed on the substrate 100, and the dielectric layer 106 is disposed on the barrier layer 104. The metal hard mask layer 108 is disposed on the dielectric layer 106. The silicon oxynitride layer 110 is disposed on the metal hard mask layer 108. The dual-damascene opening 126 exposing a part of the surface of the conductive line 102 is configured in the silicon oxynitride layer 110, the metal hard mask layer 108 and the dielectric layer 106. The conductive layer 128 is disposed in the damascene opening 126.

In one embodiment, the dual-damascene structure further includes a silicon oxide layer (not shown), disposed on the silicon oxynitride layer 112.

In another embodiment, the dual-damascene structure includes an oxide layer (not shown), disposed on the silicon oxynitride layer 112. The oxide layer is formed by performing a plasma process on the silicon oxynitride layer 112 to alter the surface property of the silicon oxynitride layer 112. The above silicon oxide layer and oxide layer serve to maintain the refractive index and the dielectric constant of the silicon oxynitride layer from altering over time.

According to the present invention, before defining a trench (or opening) in the dielectric layer, only a single etching step is performed to define a trench (or opening) pattern in the hard mask layer. Not only the process step is simplified, the cycle time is conserved. Further, the silicon oxynitride layer can absorb the reflective light from the metal mask layer to enhance the photolithograph process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a dual damascene opening, the method comprising:
   providing a substrate having a conductive region therein;
   forming a single dielectric layer over the substrate;
   forming a patterned metal hard mask layer, a patterned silicon oxynitride layer and a patterned silicon oxide layer on the single dielectric layer, wherein the patterned metal hard mask layer, the patterned silicon oxynitride layer and the patterned silicon oxide layer, each having the same pattern on the single dielectric layer to form a stacked layer;
   forming a first opening extending into but not penetrating through the single dielectric layer; and
   removing a first portion of the single dielectric layer beneath and adjacent to the first opening to form the dual damascene opening comprising a second opening that exposes a surface of the conductive region by using the stacked layer as a first mask.

2. The method of claim 1, wherein the step of forming the patterned metal hard mask layer, the patterned silicon oxynitride layer and the patterned silicon oxide layer on the single dielectric layer comprises:
   forming sequentially a metal hard mask layer, a silicon oxynitride layer and a silicon oxide layer on the single dielectric layer;
   forming sequentially a first bottom antireflection layer and a patterned photoresist layer on the silicon oxide layer;
   removing the metal hard mask layer, the silicon oxynitride layer, the oxide layer and the first bottom antireflection layer that are not covered by the patterned photoresist layer in a single process step until a part of a surface of the single dielectric layer is exposed so as to form the patterned metal hard mask layer, the patterned silicon oxynitride layer, the patterned silicon oxide layer and a patterned first bottom antireflection layer; and
   removing the patterned photoresist layer and the patterned first bottom antireflection layer.

3. The method of claim 1, wherein the patterned hard mask layer is formed with a material selected from the group consisting of tantalum, tantalum nitride, titanium, titanium nitride, tungsten and tungsten nitride.

4. The method of claim 1, wherein the step of forming the first opening in the single dielectric layer comprising:
   forming a second patterned photoresist layer over the substrate to expose a surface of a second portion of the single dielectric layer not covered by the patterned oxide layer and the patterned silicon oxynitride layer; and
   removing the second portion of the single dielectric layer to form the first opening in the single dielectric layer by using the second patterned photoresist layer as a second mask; and
   removing the second patterned photoresist layer.

5. The method of claim 4, wherein before the step of forming the second patterned photoresist layer is performed, a second bottom antireflection layer is further formed over the substrate.

6. The method of claim 1, wherein the stacked layer has a trench pattern.

7. The method of claim 1, wherein the conductive region is a conductive line.

8. The method of claim 1, wherein the single dielectric layer is formed with a material comprising a low dielectric constant material.

9. A fabrication method of a dual damascene opening, the method comprising:

provides a substrate having a conductive region therein;

forming a single dielectric layer over the substrate;

forming sequentially a metal hard mask layer and a silicon oxynitride layer over the single dielectric layer;

performing a surface property alteration process to form a modified layer on the silicon oxynitride layer;

patterning the modified layer, the silicon oxynitride layer and the metal hard mask layer to form a patterned modified layer, a patterned silicon oxynitride layer and a patterned metal hard mask layer having the same pattern so as to form a stacked layer;

forming a first opening extending into but not penetrating through the single dielectric layer; and removing a first portion of the single dielectric layer beneath and adjacent to the first opening to form the dual damascene opening comprising a second opening that exposes a surface of the conductive region by using the stacked layer as a first mask.

10. The method of claim 9, wherein the surface property alteration process comprises a plasma process.

11. The method of claim 9, wherein the step of patterning the modified layer, the silicon oxynitride layer and the metal hard mask layer comprises:

forming sequentially a metal hard mask layer and a silicon oxynitride layer on the single dielectric layer before the step of performing the surface property alteration process is conducted;

forming sequentially a first bottom antireflection layer and a patterned photoresist layer, on the modified layer;

removing the metal hard mask layer, the silicon oxynitride layer, the modified layer and the first bottom antireflection layer that are not covered by the patterned photoresist layer in a single process step until a part of a surface of the single dielectric layer is exposed so as to form the patterned metal hard mask layer, the patterned silicon oxynitride layer, the patterned modified layer and a patterned first bottom antireflection layer; and removing the patterned photoresist layer and the patterned first bottom antireflection layer.

12. The method of claim 9, wherein the patterned hard mask layer is formed with a material selected from the group consisting of tantalum, tantalum nitride, titanium, titanium nitride, tungsten and tungsten nitride.

13. The method of claim 9, wherein the step of forming the first opening in the single dielectric layer comprising:

forming a second patterned photoresist layer over the substrate to expose a surface of a second portion of the single dielectric layer not covered by the patterned oxide layer and the patterned silicon oxynitride layer; and removing the second portion of the single dielectric layer to form the first opening in the dielectric layer by using the second patterned photoresist layer as a second mask; and removing the second patterned photoresist layer.

14. The method of claim 13, wherein before the step of forming the second patterned photoresist layer is performed, a second bottom antireflection layer is further formed over the substrate.

15. The method of claim 9, wherein the stacked layer has a trench pattern.

16. The method of claim 9, wherein the conductive region is a conductive line.

\* \* \* \* \*